United States Patent [19]

Cho

[11] Patent Number: 5,045,809

[45] Date of Patent: Sep. 3, 1991

[54] AUTOMATIC GAIN CONTROL (AGC) CIRCUIT FOR A TRUNK INTERFACE IN A PRIVATE BRANCH EXCHANGE (PBX)

[75] Inventor: Won-Sang Cho, Puch-city, Rep. of Korea

[73] Assignee: SamSung Electronics Co., Ltd., Kyung Ki-Do, Rep. of Korea

[21] Appl. No.: 400,936

[22] Filed: Aug. 31, 1989

[51] Int. Cl.⁵ .............................................. H03G 5/32
[52] U.S. Cl. ..................................... 330/284; 330/280; 379/347
[58] Field of Search ................ 330/138, 145, 280, 284; 379/296, 347

[56] References Cited

U.S. PATENT DOCUMENTS 3,927,381  12/1975  Sato et al. ........................ 330/284 X Primary Examiner—James B. Mullins
Attorney, Agent, or Firm—Robert E. Bushnell

[57] ABSTRACT

An Automatic Gain Control (AGC) circuit which compensates receiving sensitivity on the part of subscribers depending on the line status of a central office line (C.O.L.) in a private branch exchange (PBX), by means of using an analog system, utterly. In order to achieve these objects, the present invention includes: an amplification circuit for amplifying input signals; a rectification circuit, connected to the amplification circuit for converting output signals of the amplification into DC voltage whose level corresponds to said output signals; first and second differential amplifiers for receiving the DC voltage and given automatic gain control signals and comparing the two signals so as to output a given DC voltage level; and first and second impedance control circuits, connected to output ports of said first and second differential amplifiers respectively, for controlling output impedances thereof in response to the outputs of the first and second differential amplifiers, the output ports of the first and second differential amplifiers being connected to input port of the amplification circuit through a capacitance.

32 Claims, 1 Drawing Sheet

AUTOMATIC GAIN CONTROL (AGC) CIRCUIT FOR A TRUNK INTERFACE IN A PRIVATE BRANCH EXCHANGE (PBX)

BACKGROUND OF THE INVENTION

The present invention relates to an Automatic Gain Control (AGC) circuit, and specifically to an AGC circuit which compensates receiving sensitivity on the part of a subscriber depending on the line status of a central office line (C.O.L) in a private branch exchange(PBX).

In the PBX system, it becomes necessary to improve performance of the PBX by upgrading sensitivity of the central office line through adjusting sensitivity based on the status changes of the central office lines in a trunk circuit.

To achieve the upgrade of the sensitivity, in a conventional method, the AGC circuit adopts digital scheme and is designated in such a way that additional gain memory devices are installed in the PBX of the time division multiplexing type and then the gain memory devices are selected by software-control, otherwise, another way with the use of transistors in a trunk circuit is adopted; therefore, relative commands have to be given from the outside.

SUMMARY OF THE INVENTION

Therefore, a primary object of the invention is to provide a circuit which compensates sensitivity depending on the changes of characteristics and status of central office line by maintaining voice signal levels.

Another object of the invention is to provide an Automatic Gain Control circuit adopting not a digital system, but an analog system, utterly.

In order to achieve the above objects, the present invention includes: an amplification circuit for amplifying input signals; a rectification circuit that is connected with the amplification circuit and converts output signals from the circuit into a DC voltage level; first and second differential amplifiers into which output of said rectification circuit and automatic gain control signal is applied and in which said output is compared with reference voltage level; a first and a second impedance control circuits which are connected with output ports of said differential amplifiers respectively, to control output impedances according to corresponding outputs of said differential amplifiers and whose output ports are connected with said amplification circuit, so that if the DC level of output signal is higher than the reference level, it decreases the impedance of the second impedance control circuit in order to reduce the gain of said amplification circuit and, in contrary, it increases the impedance to increase the gain. However, if the level of input signal is relatively low such as noise voltage levels, it is protected from nose by the first impedance control circuit.

BRIEF DESCRIPTION OF THE ATTACHED DRAWINGS

For a better understanding of the invention and to show how the same may be carried into effect, reference will now be made, by way of example, to the accompanying diagrammatic drawings, in which:

FIG. 1 is a system block diagram showing automatic control circuits employed in a private branch exchange according to the invention; and FIG. 2 is a circuit diagram for carrying out an embodiment of the invention.

DETAILED DESCRIPTION OF THE INVENTION

Hereinafter, the present invention is described in detail with the attached drawings.

Figure 1:
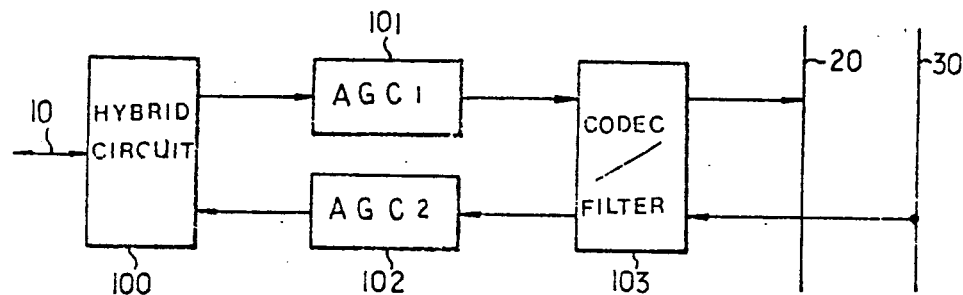

FIG. 1 is a system interfacing diagram showing a case that the automatic gain control circuit is applied to the trunk circuit in the PBX according to the present invention; reference number 100 is an hybrid circuit, reference numbers 101 and 102 are automatic gain control circuits in accordance with the present invention, and reference number 103 is a codec and filter circuit. In addition, reference number 10 is tip/ring line of the C.O.L., reference numbers 20 and 30 are a transmission line and a reception line respectively for multiplexed pulse code modulation (PCM) voice signals.

A conventional trunk circuit comprised of a hybrid circuit 100 converts voice signals of two lines of C.O.L. tip/ring line 10 into receiving voice signals and sends transmission voice signals of said two lines to the central office tip/ring line 10, and a codec and filter circuit 103 coding and decoding the transmission and receiving signals by the PCM method.

Accordingly, with addition of the AGC circuits 101, 102 on the respective transmission and the receiving lines placed between the conventional hybrid circuit 100, and the codec and filter circuit 103, voice signals are maintained at a stable level regardless of the changing status of the central office tip/ring line 10 so that subscribers of the PBX can have higher sensitivity in a telephonic communication.

To put it more precisely, if a voice signal level received by the subscribers of the PBX is low, gain for compensation is increased in the AGC circuit 101 so as to provide stability of the receiving voice signals; if the voice signal level is high, the gain is decreased to ensure voice signal stability in receiving.

Contrarily, in case a transmission is made toward the C.O.L., the AGC circuit 102 operates in the same way as above so as to send specified suitable voice signals to the C.O.L.

Figure 2:
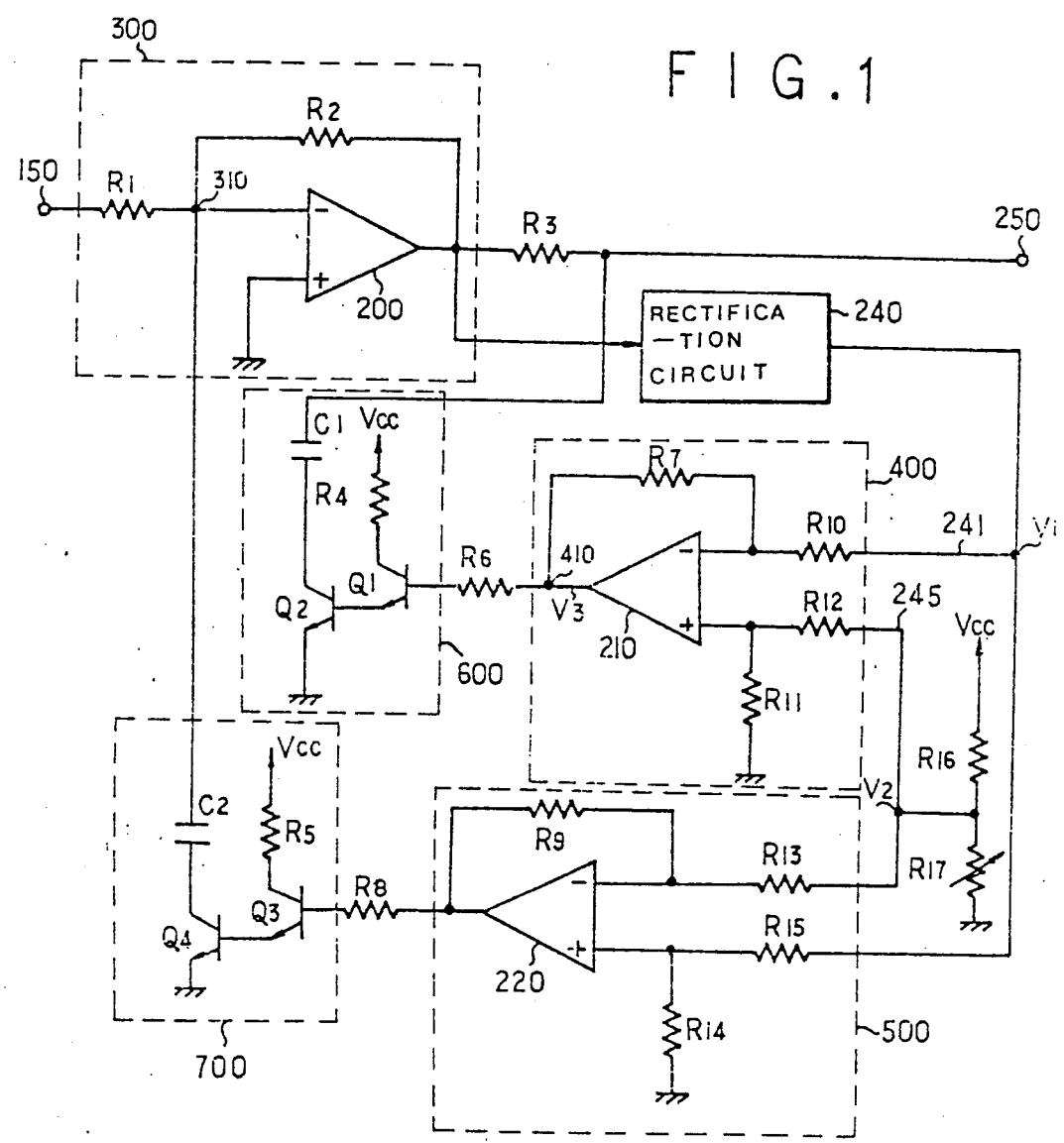

FIG. 2 is a systematic diagram of the AGC circuits 101, 102 according to the present invention, wherein R1-R17 are resistors, C1 and C2 are capacitors, Q1-Q4 are transistors, reference numbers 200, 210 and 220 are operational amplifiers, Vcc designates power supply voltage and reference number 240 is a rectification circuit composed of a filter that rectifies voice signals and converts the voice signals into direct current (DC).

Next, reference number 300 is an amplification circuit that performs inverse amplification using operational amplifier 200, reference numbers 400 and 500 are the first and second differential amplification circuits respectively that perform differential amplification, reference numbers 600 and 700 are the first and second impedance control circuits in which a pair of transistors Q1 and Q2 are connected and another pair of transistors Q3 and Q4 are connected in two stages, respectively.

The amplification circuit 300 is a circuit that amplifies voice signals applied from input port 150 which is connected to an inverse port (−) of operational amplifier 200 via the resistor R1, while a non-inverse port (+) is grounded. In addition, the inverse port (−) is connected to the output port of said operational amplifier 200 through the resistor R2 and at the same time linked with the second impedance control circuit 700, which shall be described later.

Accordingly, said amplification circuit 300 performs amplification in response to the changes of the output impedances of the second impedance control circuit 700. Also, output of the operational amplifier 200 is connected to the rectification circuit 240. The rectification circuit 240 is a known circuit including a rectifier which rectifies the voice signals coming from the amplification circuit 300 and a filter which smoothes the voice signals into stable a DC voltage.

The port of the rectification circuit 240 is connected to inverse port (−) of the operational amplifier 210 through the resistor R10 of the first differential amplification circuit 400 and at the same time connected to a non-inverse port (+) of the operational amplifier 220 through the resistor R15 of the second differential amplification circuit 500, while input port of said non-inverse port (+) is grounded through the resistor R14.

Additionally, in the first differential amplification circuit 400 and the second differential amplification circuit 500, a voltage divided from the power supply (Vcc) by the resistor R16 and the variable resistor R17 is applied through resistor R12 to the non-inverting port (+), which is grounded through the resistor R11, of the operational amplifier 210 which is part of the first differential amplification circuit 400; at the same time, the automatic gain control signal is applied into the inverse port (−) of the operational amplifier 220 which is part of the second differential amplification circuit 500 through R13. In this case, the attention must be paid to the possibility that the automatic control signals may be applied from not only the AGC elements of R16 and R17 but also other external circuits.

On the other hand, the resistor R7 is connected between the inverse port (−) and an output port of the operational amplifier 210; and the resistor R9 is connected between the inverse port (−) and output of the operational amplifier 220. If it is assumed that output voltage of the rectification circuit 240, which is a voltage of line 241 applied into the inverse port (−) of the first differential amplification circuit 400 is V1, voltage of line 245 which is a voltage of the automatic gain control signal is V2, and a voltage of output port 410 of said amplification circuit 400 is V3, a value of the differential amplification voltage V3 is given as follows;

$$V3 = \frac{R10 + R7}{R10} \left[ \frac{R11}{R11 + R12} V2 - \frac{R7}{R10 + R7} V1 \right] \quad (1)$$

In the same way, the output voltage of the second differential amplification circuit 500 is obtained, simply substituting the corresponding resistors in the equation (1). Accordingly, if a voice signal of amplification circuit 300 is amplified in a specified amplification level, the second differential amplification circuit 500 produces positive (+) voltage, but if not, it produces negative (−) voltage.

On the other hand, the first differential amplification circuit 400 is a circuit which produces either positive(+) voltage if output of the amplification circuit 300 is below a specified level, or negative(−) voltage if the output is above the specified level and provides a voltage level, which is required to remove noises as will be described later, to the first impedance control circuit 600.

The first and second impedance circuits 600, 700 are each connected to the output of the first and second differential amplification circuit 400, 500, by way of the resistors R6, R8, respectively. Moreover, the output of the first impedance control circuit 600 is connected to the output of the amplification circuit 300 by way of resistor R3, whereas the output of the second impedance control circuit 700 is connected to a node 310 of the inverse input of the operational amplifier 200, respectively.

Accordingly, in the first and second impedance control circuits 600 and 700, the dynamic impedance between collectors and emitters of the transistors Q2 and Q4 changes in response to conductive states of transistors Q1, Q2 as well as Q3, Q4. Therefore, the impedance will have the smallest value when the transistors are in the saturation state.

Hereinafter, the further description of the preferred embodiment will be given on operational aspects of the AGC circuit shown in FIG. 2.

The voice signal inputted from input port 150 is primarily amplified by the amplification circuit 300, and the amplified voice signal is transferred to the rectification circuit 240 by which the voice signal is converted into the DC signal corresponding to said amplified voice signal. Then, it is sent to the next stage. Said DC signal is compared in the first and second differential amplification circuits 400 and 500 with an input signal from the AGC which is provided to line 245, so as to produces a required amount of positive(+) or negative(−) DC voltage.

As a result, if the voice signal from the input port 150 is so high that the DC signal level, which is produced in the rectification circuit 240 corresponding with the voice signal level amplified in said amplification circuit 300 and also becomes higher than the input signal level for automatic gain control, the first differential amplification circuit 400 produces a negative voltage level while the second differential amplification circuit 500 produces a positive voltage level. Accordingly, the two-stage transistor of the first impedance control circuit 600 goes to an "off" state causing high impedance, while the other two-stage transistor of second impedance control circuit 700 receiving the positive (+) voltage level of said second differential amplification circuit 500 as bias voltage controls the output impedance in response to said bias. Therefore, the voice signal level from the input port 150 into the inverse port(−) of the operational amplifier 200, is controlled and outputted to the line 250 in response to said impedance of the second impedance control circuit 700.

On the other hand, if the voice signal is relatively low, input signal level for AGC provided to line 245 reaches a higher level than that of the DC voltage level corresponding with said voice signal produced by said rectification circuit 240. Therefore, output voltage level of second differential amplification circuit 500 becomes a negative signal(−), so that the second impedance control circuit 700 ceases its operation causing high impedance, which then enables the amplification circuit 300 to output an amplified voice signal with a maximum gain to the output port 250, under the condition of amplification factor R2/R1.

Therefore, in this case, the low input signal is amplified by a great amount, however if the amplification is excessively large, a great amount of noise is output to the output port 250. To avoid such difficulties, it is necessary to adjust the resistance of resistors R7, R10 of the first differential amplification circuit 400 in order to produce a voltage level suitable for removing the noise and have this voltage level to reduce the impedance of the first impedance control circuit 400 so as to provide an adjustment for the signal produced by said amplification circuit 300 to be by-passed through the capacitor C1, collector and emitter of transistor Q2.

Accordingly, if the voice signal from the input port 150 is greater than a given proper value, the level of output voice signal is lowered by decreasing the impedance of the second impedance control circuit 700; however, if smaller, the impedance of the second impedance control circuit 700 becomes high for greater amplification level of amplification circuit 300 and decreases the impedance of the first impedance control circuit 600 by adjusting output voltage level of the first differential amplification circuit 400; thus, a noise reduction effect is achieved.

The port of amplification circuit 300 is connected to the first impedance control circuit through resistor R3 in order to ensure that even if a signal with a low voice signal level is inputted from the input port 150 to cause lower impedance of the first impedance control circuit 600, the output of the amplification circuit 300 is prevented from sudden pull-down and output impedance of the second impedance control circuit 700 is increased, so that sufficient amplification is obtained by the amplification circuit 300.

Therefore, the present invention presents such advantage that, as shown in the foregoing description, the C.O.L. sensitivity of the PBX in telephonic communication is highly improved and noise caused by receiving low level signals is reduced by maintaining optimum output level by means of amplifying input signal level up to a specified suitable value when its level is excessively low, or of decreasing the gain when its level is excessively high.

The above description shows only a preferred embodiment of the present invention that can be applied to the PBX. However, it might be apparent to those skilled in the art that the present invention can be applied to an equalization circuit which maintains constant output signal level against changing input signals.

What is claimed is:

1. An automatic gain control circuit for a private branch exchange, said circuit comprising:
   an amplification circuit for providing amplified signals by amplifying input signals;
   a rectification circuit, connected to the amplification circuit, for converting said amplified signals of the amplification circuit into a direct voltage exhibiting a first voltage amplitude corresponding to said amplified signals;
   first and second differential amplifiers having output ports, for receiving said direct voltage and given automatic gain control signals and for comparing said direct voltage and automatic gain control signals so as to respectively output intermediate signals exhibiting an intermediate voltage amplitude; and
   first and second impedance control circuits, connected to output ports of said first and second differential amplifiers respectively, for receiving the intermediate signals of the first and second differential amplifiers, said output ports of the first and second differential amplifiers being connected across the amplification circuit through respective capacitance impedances so as to reduce gain of the amplification circuit by decreasing the output impedance of said second impedance control circuit when an excessively high level input signal is applied, or increasing said gain of the amplification circuit by increasing the output impedance of said second impedance control circuit as well as controlling the output impedance of the first impedance control circuit for removing noise when an excessively low input level signal is applied.

2. The circuit of claim 1, further comprised of said first and second impedance control circuits each including:
   a corresponding one of said capacitive impedances being coupled to said amplification circuit;
   a first transistor having a base electrode, and having collector and emitter electrodes coupled between said corresponding ones of said capacitive impedances and a reference potential; and
   a second transistor having a base electrode connected to a corresponding one of said output ports, and collector and emitter electrodes connectable between a voltage source terminal and said reference potential.

3. The circuit of claim 2, further comprised of:
   said first and second differential amplifiers being coupled to receive said automatic gain control signals at a first node;
   a first resistance coupled between said voltage source terminal and said first node; and
   a second resistance coupled between said first node and said reference potential.

4. The circuit of said 2, wherein said amplification circuit comprises:
   an input terminal;
   an output terminal;
   means including first and second input ports, and a third output port, for amplifying differences between signals applied to said first and second input ports;
   a first resistance coupled between said input terminal and said first input port;
   a second resistance coupled between said first input port and said third output port; and
   a third resistance coupled between said third output port and output terminal.

5. The circuit of claim 2, wherein said amplification circuit comprises:
   an input terminal;
   an output terminal;
   means including first and second input ports, and a third output port, for amplifying input signals applied to said first one of said input ports;
   a first resistance coupled between said input terminal and said first input port, said second one of said impedance control circuits being coupled to said first input port;
   a second resistance coupled between said first input port and said third output port, said output port being coupled to said rectification circuit; and
   a third resistance coupled between said third output port and said output terminal, with said first one of said impedance control circuits being coupled to said output terminal.

6. The circuit of claim 2, further comprised of:
   said first differential amplifier having first and second input electrodes, and one of said output ports;

a first resistance coupled between said base electrode of said second transistor of said first impedance control circuit and said one of said output ports;
a second resistance coupled between said first of said input electrodes and said one of said output ports;
a third resistance coupled between said first of said input electrodes and said rectification circuit;
a fourth resistance coupled between said second of said input electrodes and a first node; and
a first resistance coupled between said second of said input electrodes and said reference potential.

7. The circuit of claim 1, further comprised of:
said first and second differential amplifiers being coupled to receive said automatic gain control signals at a first node;
a first resistance coupled between a voltage source terminal and said first node; and
a second resistance coupled between said first node and a reference potential.

8. The circuit of claim 7, wherein said amplification circuit comprises:
an input terminal;
an output terminal;
means including first and second input ports, and a third output port, for amplifying input signals applied to said first one of said input ports;
a first resistance coupled between said input terminal and said first input port;
a second resistance coupled between said first input port and said third output port; and
a third resistance coupled between said third output port and said output terminal.

9. The circuit of claim 8, further comprising:
said second one of said impedance control circuits being coupled to said first input port;
said third output port being coupled to said rectification circuit; and
said first one of said impedance control circuits being coupled to said third output terminal.

10. The circuit of claim 9, further comprised of:
said first differential amplifier having first and second input electrodes, and one of said output ports;
a fourth resistance coupled between said first impedance control circuit and said one of said output ports;
a fifth resistance coupled between said first of said input electrodes and said one of said output ports;
a sixth resistance coupled between said second of said input electrodes and said rectification circuit;
a seventh resistance coupled between said second of said input electrodes and a first node; and
a eighth resistance coupled between said second of said input electrodes and said reference potential.

11. The circuit of claim 1, wherein said amplification circuit comprises:
an input terminal;
an output terminal;
means including first and second input ports, and a third output port, for amplifying differences between signals applied to said first and second input ports;
a first resistance coupled between said input terminal and said first input port;
a second resistance coupled between said first input port and said third output port; and
a third resistance coupled between said third output port and said output terminal.

12. The circuit of claim 1, wherein said amplification circuit comprises:
an input terminal;
an output terminal;
means including first and second input ports, and a third output port, for amplifying input signals applied to said first one of said input ports;
a first resistance coupled between said input terminal and said first input port, said second one of said impedance control circuits being coupled to said first input port;
a second resistance coupled between said first input port and said third output port, said third output port being coupled to said rectification circuit; and
a third resistance coupled between said third output port and said output terminal, with said first one of said impedance control circuits being coupled to said output terminal.

13. The circuit of claim 1, further comprised of:
said first differential amplifier having first and second input electrodes, and one of said output ports;
a first resistance coupled between said first impedance control circuit and said one of said output ports;
a second resistance coupled between said first of said input electrodes and said one of said output ports;
a third resistance coupled between said first of said input electrodes and said rectification circuit;
a fourth resistance coupled between said second of said input electrodes and a first node; and
a fifth resistance coupled between said second of said input electrodes and a reference potential.

14. An automatic gain control circuit said circuit comprising:
circuit means having a first input port and an output node, for receiving input signals;
rectification means for receiving from said circuit means and converting said input signals into direct current signals exhibiting voltage amplitudes corresponding to said input signals;
a plurality of differential amplifiers for providing intermediate signals by making comparisons between said direct current signals and automatic gain control signals; and
a plurality of impedance control means connected to output ports of respective ones of said differential amplifiers, for controlling output impedances in response to corresponding ones of said intermediate signals, a first one of said impedance control means being connected to said input port of the circuit means and a second one of said impedance control means being connected to said output node of the circuit means, respectively.

15. The circuit of claim 14, further comprised of said impedance control means being provided by a plurality of impedance circuits each including:
a capacitance impedance being coupled to said amplification circuit;
a first transistor having a base electrode, and having collector and emitter electrodes coupled between said capacitive impedance and a reference potential;
a second transistor having a base electrode connected to a corresponding one of said output ports, and collector and emitter electrodes connectable between a voltage source terminal and said reference potential.

16. The circuit of claim 15, further comprised of:

said first and second differential amplifiers being coupled to receive said automatic gain control signals at a first node;
a first resistance coupled between said voltage source terminal and said first node; and
a second resistance coupled between said first node and said reference potential.

17. The circuit of claim 15, wherein said receiving circuit means comprises:
an input terminal;
an output terminal;
means including said first input port and a second input port, and providing said output node, for amplifying input signals applied to said first input port;
a first resistance coupled between said input terminal and said first input port;
a second resistances coupled between said first input port and said output node; and
a third resistance coupled between said output node and said output terminal.

18. The circuit of claim 15, wherein said receiving circuit means comprises:
an input terminal;
an output terminal;
means including said first input port and a second input port, and providing said output node, for amplifying input signals applied to said first input port;
a first resistance coupled between said input terminal and said first input port, a first one of said impedance control means being coupled to said first input port;
a second resistance coupled between said first input port and said output node, said output node being coupled to said rectification circuit; and
a third resistance coupled between said output node and said output terminal, with a second one of said impedance control means being coupled to said output terminal.

19. The circuit of claim 15, further comprised of:
one of said differential amplifiers having first and second input electrodes, and one of said output ports;
a first resistance coupled between a first one of said plurality of impedance control means and said one of said output ports;
a second resistance coupled between said first of said input electrodes and said one of said output ports;
a third resistance coupled between said first of said input electrodes and said rectification means;
a fourth resistance coupled between said second of said input electrodes and a first node; and
a fifth resistance coupled between said second of said input electrodes and said reference potential.

20. The circuit of claim 14, further comprised of:
said differential amplifiers being coupled to receive said automatic gain control signals at a first node;
a first resistance coupled between a voltage source terminal and said first node; and
a second resistance coupled between said first node and a reference potential.

21. The circuit of claim 20, wherein said receiving circuit means comprises:
an output terminal;
an output terminal;
means including said first input port and a second input port, and providing said output node, for amplifying input signals applied to said first input port;
a third resistance coupled between said input terminal and said first input port;
a fourth resistance coupled between said first input port and said output node; and
a fifth resistance coupled between said output node and said output terminal.

22. The circuit of claim 21, further comprising:
said output node being coupled to said rectification circuit.

23. The circuit of claim 22, further comprised of:
one of said differential amplifiers having first and second input electrodes, and one of said output ports;
a sixth resistance coupled between a first one of said plurality of impedance control means and said one of said output ports;
a seventh resistance coupled between said first of said input electrodes and said one of said output ports;
a eight resistance coupled between said first of said input electrodes and said rectification means;
a ninth resistance coupled between said second of said input electrodes and said first node; and
a tenth resistance coupled between said second of said input electrodes and said reference potential.

24. The circuit of claim 14, wherein said receiving circuit means comprises:
an input terminal;
an output terminal;
means including said first input port and a second input port, and providing said output node, for amplifying input signals applied to said first one of said input ports;
a first resistance coupled between said input terminal and said first input port;
a second resistance coupled between said first input port and said output node; and
a third resistance coupled between said output node and said output terminal.

25. The circuit of claim 14, wherein said receiving circuit means comprises:
an input terminal;
an output terminal;
means including the first input port and a second input port, and providing said output node, for amplifying input signals applied to said first input port;
a first resistance coupled between said input terminal and said first input port, a first one of said impedance control means being coupled to said first input port;
a second resistance coupled between said first input port and said output node, said output node being coupled to said rectification means; and
a third resistance coupled between said output node and said output terminal, with a second one of said impedance control means being coupled to said output terminal.

26. The circuit of claim 14, further comprised of:
one of said differential amplifiers having first and second input electrodes, and one of said output ports;
a first resistance coupled between a first one of said plurality of impedance control means and said one of said output ports;
a second resistance coupled between said first input electrode and said one of said output ports;

a third resistance coupled between said first input electrode and said rectification means;

a fourth resistance coupled between said second input electrode and a first node; and a fifth resistance coupled between said second input electrode and a reference potential.

27. An automatic gain control process, said process comprising:

receiving input signals at an input terminal;

providing amplified signals at an output terminal by amplifying input signals received;

converting said amplified signals into direct voltages exhibiting first voltage amplitudes corresponding to said amplified signals;

receiving said direct voltages and automatic gain control signals and comparing said direct voltages and automatic gain control signals using first and second differential amplifiers to output intermediate signals exhibiting intermediate voltage amplitudes; and controlling output impedances between said input terminal and a corresponding one of said first and second differential amplifiers, and between said output terminal and another one of said first and second differential amplifiers in response to the intermediate signals by using first and second impedance control stages, to reduce gain of the amplified signals by decreasing output impedance of the second impedance control circuit when an input signal having an excessively high amplitude is received, or increasing said gain of the amplified signals by increasing the output impedance of the second impedance control circuit and controlling output impedance of the first impedance control to remove noise, when an input signal having excessively low amplitude is received.

28. An automatic gain control circuit, comprising:

circuit means having input and output terminals for receiving input signals at said input terminal;

means for converting said input signals into direct current signals exhibiting voltage amplitudes influenced by amplitudes of said input signals;

means coupled to receive reference signals and said direct current signals, for generating a plurality of intermediate signals at a plurality of output nodes, with a first of said intermediate signals exhibiting a first state during a first mode when amplitude of said direct current signals is greater than amplitude of said reference signals, a second of said intermediate signals exhibiting a second state during said first mode, said second of said intermediate signals exhibiting said first state during a second mode when amplitude of said direct current signals is less than amplitude of said reference signals; and control means coupled across said receiving means and between said receiving means and said plurality of output nodes of said generating means to receive corresponding different ones of said plurality of intermediate signals, for controlling impedances between a first one of said plurality of output nodes and said input terminal of said receiving means and between a second one of said plurality of output nodes and said output terminal of said receiving means, in dependence upon amplitudes of said first and second intermediate signals.

29. The circuit of claim 28, further comprised of said generating means generating said first of said intermediate signals exhibiting said second state during said second mode.

30. The circuit of claim 28, wherein said receiving means comprises:

means including first and second input ports, and an intermediate node, for amplifying input signals applied to said first input port;

a first resistance coupled between said input terminal and said first input port, with said control means coupled to provide a first control signal to said first input port;

a second resistance coupled between said first input port and said intermediate node, said intermediate node being coupled to said converting means; and a third resistance coupled between said intermediate node and said output terminal, with said control mean coupled to provide a second control signal to said output terminal.

31. A gain control circuit, comprising:

an input terminal connectable to receive input signals;

an output terminal;

means including first and second input ports, and an output node, for amplifying input signals applied to said first input port to provide amplified signals;

a first resistance coupled between said input terminal and said first input port;

a second resistance coupled between said first input port and said output node;

a third resistance coupled between said output node and said output terminal;

means for converting said amplified signals into direct current signals exhibiting voltage amplitudes influenced by amplitudes of said amplified signals, said output node being coupled to said converting means;

first and second differential amplifiers each having first and second input electrodes, and an output electrode;

fourth resistances coupled to corresponding ones of output electrodes of said first and second differential amplifiers;

fifth resistances coupled between corresponding ones of said first of said input electrodes and said output electrodes;

sixth resistances coupled between corresponding ones of said first of said input electrodes and said converting means;

seventh resistances coupled between corresponding ones of said second of said input electrodes and a first node; and eighth resistances coupled between corresponding ones of said second of said input electrodes and a reference potential;

a plurality of capacitive impedances coupled across said amplification circuit;

a first one of said capacitive impedances being coupled to said output terminal;

a second one of said capacitive impedances being coupled to said first input port;

a first transistor having a base electrode coupled to said output electrode of said first one of said differential amplifiers, a first terminal of said first transistor being coupled to a voltage source terminal;

a second transistor having a base electrode connected to a second terminal of said first transistor not coupled to said voltage source terminal, and collector and emitter electrodes connectable between said reference potential terminal and said first one of said capacitive impedances;

a third transistor having a base electrode coupled to said output electrode of said second one of said differential amplifiers, a first terminal of said third transistor being coupled to a voltage source terminal;

a fourth transistor having a base electrode connected to a second terminal of said third transistor not coupled to said voltage source terminal, and collector and emitter electrodes connectable between said reference potential terminal and said second one of said capacitive impedances.

32. The circuit of claim 31, further comprised of:

said first and second differential amplifiers being coupled to receive automatic gain control signals at said first node;

a ninth resistance coupled between a voltage source terminal and said first node; and a tenth resistance coupled between said first node and a reference potential.

* * * * *

UNITED STATES PATENT AND TRADEMARK OFFICE
CERTIFICATE OF CORRECTION

PATENT NO. : 5,045,809

DATED : 3 September 1991

INVENTOR(S) : Won-Sang CHO

It is certified that error appears in the above-identified patent and that said Letters Patent is hereby corrected as shown below:

Column 1,   Line 44,   insert --a-- after "with";

Line 45,   delete "a" (first and second occurrence);

Line 56,   insert --as-- before "low", and delete "such";

Line 57,   change "nose" to --noise--;

Column 2,   Line 65,   delete "the";

Column 3,   Line 25,   delete "the" (first occurrence);

Line 47,   change ";" to --:--.

Claim 4,    Column 6,   Line 33,   change "said" to --claim--;

Claim 15,   Column 8,   Line 62,   insert --and-- after "potential;";

Claim 17,   Column 9,   Line 18,   change "resistances" to --resistance--;

Claim 23,   Column 10,  Line 21,   change "eight" to --eighth--;

UNITED STATES PATENT AND TRADEMARK OFFICE
CERTIFICATE OF CORRECTION

PATENT NO. : 5,045,809

DATED : September 3, 1991

INVENTOR(S) : Won-Sang CHO

It is certified that error appears in the above-identified patent and that said Letters Patent is hereby corrected as shown below:

Claim 31, Column 13, Line 7, insert --and-- after "terminal;".

Signed and Sealed this

Twenty-ninth Day of December, 1992

*Attest:*

DOUGLAS B. COMER

*Attesting Officer*  Acting Commissioner of Patents and Trademarks